US011133380B2

(12) United States Patent
Baburske et al.

(10) Patent No.: US 11,133,380 B2
(45) Date of Patent: Sep. 28, 2021

(54) DIODE STRUCTURE OF A POWER SEMICONDUCTOR DEVICE

(71) Applicant: Infineon Technologies AG, Neubiberg (DE)

(72) Inventors: Roman Baburske, Otterfing (DE); Philip Christoph Brandt, Oberhaching (DE); Johannes Georg Laven, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/429,476

(22) Filed: Jun. 3, 2019

(65) Prior Publication Data

US 2019/0319092 A1 Oct. 17, 2019

Related U.S. Application Data

(63) Continuation of application No. 15/708,180, filed on Sep. 19, 2017, now Pat. No. 10,340,337.

(30) Foreign Application Priority Data

Sep. 20, 2016 (DE) .......................... 102016117723.7

(51) Int. Cl.
*H01L 29/06* (2006.01)
*H01L 27/07* (2006.01)
(Continued)

(52) U.S. Cl.
CPC ........ *H01L 29/0638* (2013.01); *H01L 21/221* (2013.01); *H01L 27/0664* (2013.01);
(Continued)

(58) Field of Classification Search
None
See application file for complete search history.

(56) References Cited

U.S. PATENT DOCUMENTS 5,162,876 A * 11/1992 Kitagawa ............ H01L 29/0804
257/133
7,842,590 B2 11/2010 Gutt et al.
(Continued)

FOREIGN PATENT DOCUMENTS

CN 101764139 A 6/2010
CN 102318071 A 1/2012
(Continued)

*Primary Examiner* — Long Pham
(74) *Attorney, Agent, or Firm* — Murphy, Bilak & Homiller, PLLC

(57) ABSTRACT

A power semiconductor device includes a semiconductor body coupled to first and second load terminals. The body includes: at least a diode structure configured to conduct a load current between the terminals and including an anode port electrically connected to the first load terminal and a cathode port electrically connected to the second load terminal; and drift and field stop regions of the same conductivity type. The cathode port includes first port sections and second port sections with dopants of the opposite conductivity type. A transition between each of the second port sections and the field stop region forms a respective pn-junction that extends along a first lateral direction. A diffusion voltage of a respective one of the pn-junctions in an extension direction perpendicular to the first lateral direction is greater than a lateral voltage drop laterally overlapping with the lateral extension of the respective pn-junction.

13 Claims, 6 Drawing Sheets

(51) Int. Cl.
*H01L 29/66* (2006.01)
*H01L 21/22* (2006.01)
*H01L 27/06* (2006.01)
*H01L 29/08* (2006.01)
*H01L 29/739* (2006.01)
*H01L 29/861* (2006.01)
*H01L 29/16* (2006.01)
*H01L 29/423* (2006.01)
*H01L 29/10* (2006.01)

(52) U.S. Cl.
CPC ...... *H01L 27/0727* (2013.01); *H01L 29/0623* (2013.01); *H01L 29/0834* (2013.01); *H01L 29/66136* (2013.01); *H01L 29/66333* (2013.01); *H01L 29/66348* (2013.01); *H01L 29/7395* (2013.01); *H01L 29/7397* (2013.01); *H01L 29/861* (2013.01); *H01L 29/1095* (2013.01); *H01L 29/1608* (2013.01); *H01L 29/4238* (2013.01)

(56) References Cited

U.S. PATENT DOCUMENTS

| | | | | |
|---|---|---|---|---|
| 2009/0001411 | A1* | 1/2009 | Tokura | H01L 29/7397 257/140 |
| 2010/0090248 | A1* | 4/2010 | Kouno | H01L 29/861 257/140 |
| 2012/0043581 | A1* | 2/2012 | Koyama | H01L 29/8613 257/140 |
| 2012/0080718 | A1 | 4/2012 | Soeno | |
| 2012/0193676 | A1* | 8/2012 | Bobde | H01L 29/7391 257/140 |
| 2012/0319163 | A1* | 12/2012 | Tsuzuki | H01L 29/7397 257/140 |
| 2013/0001639 | A1* | 1/2013 | Iwasaki | H01L 29/7397 257/140 |
| 2013/0248924 | A1* | 9/2013 | Matsudai | H01L 29/0834 257/139 |
| 2015/0236143 | A1* | 8/2015 | Pfirsch | H01L 29/0696 257/133 |
| 2015/0262999 | A1 | 9/2015 | Ogura | |
| 2018/0261700 | A1* | 9/2018 | Tanaka | H01L 29/0684 |

FOREIGN PATENT DOCUMENTS

| | | |
|---|---|---|
| CN | 102959705 A | 3/2013 |
| CN | 105006489 A | 10/2015 |
| DE | 102009019278 A1 | 11/2009 |
| DE | 102009055322 A1 | 8/2010 |
| DE | 102011086854 A1 | 11/2011 |
| DE | 102012210053 A1 | 12/2012 |
| DE | 102015102129 A1 | 8/2015 |

\* cited by examiner

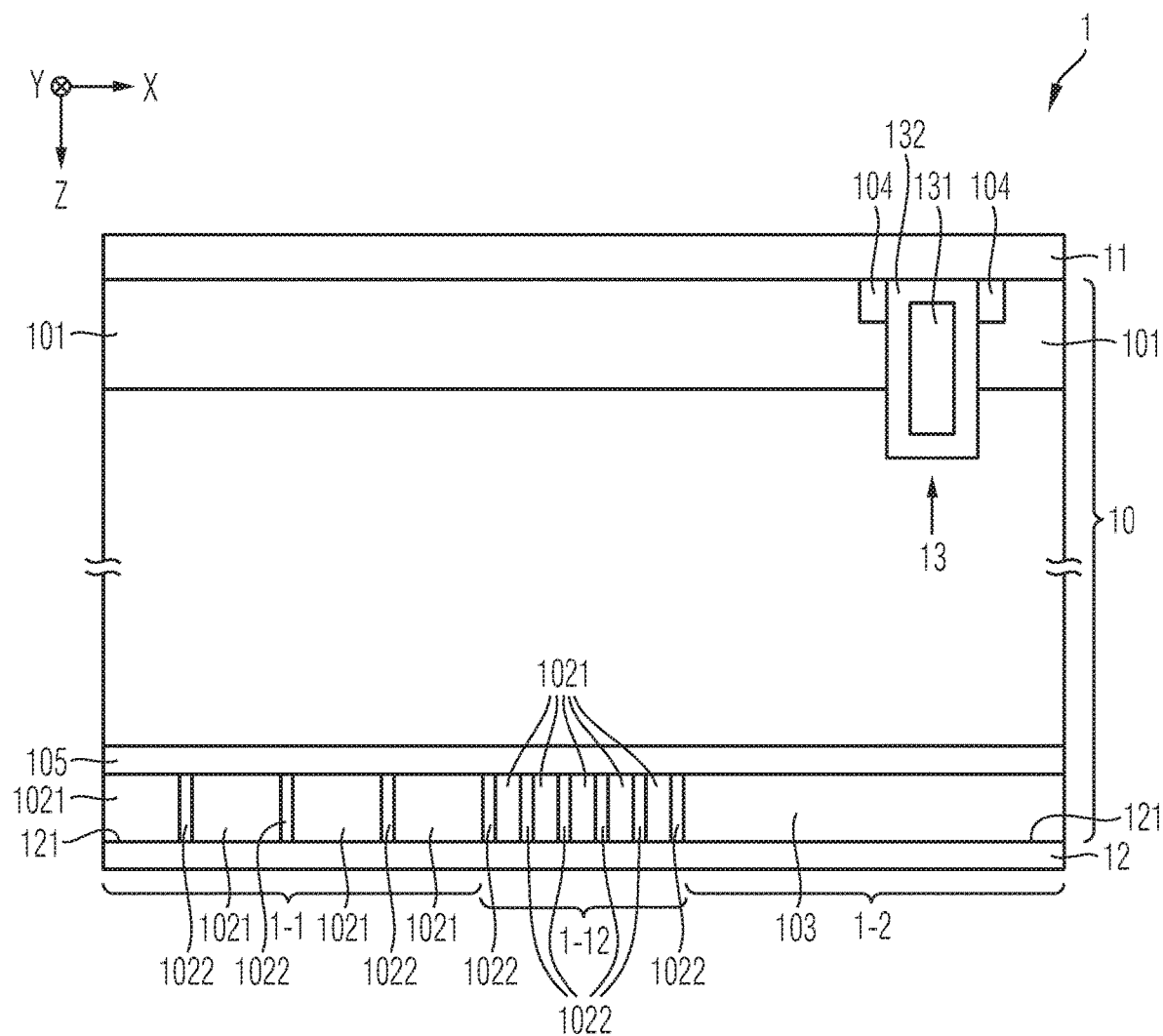

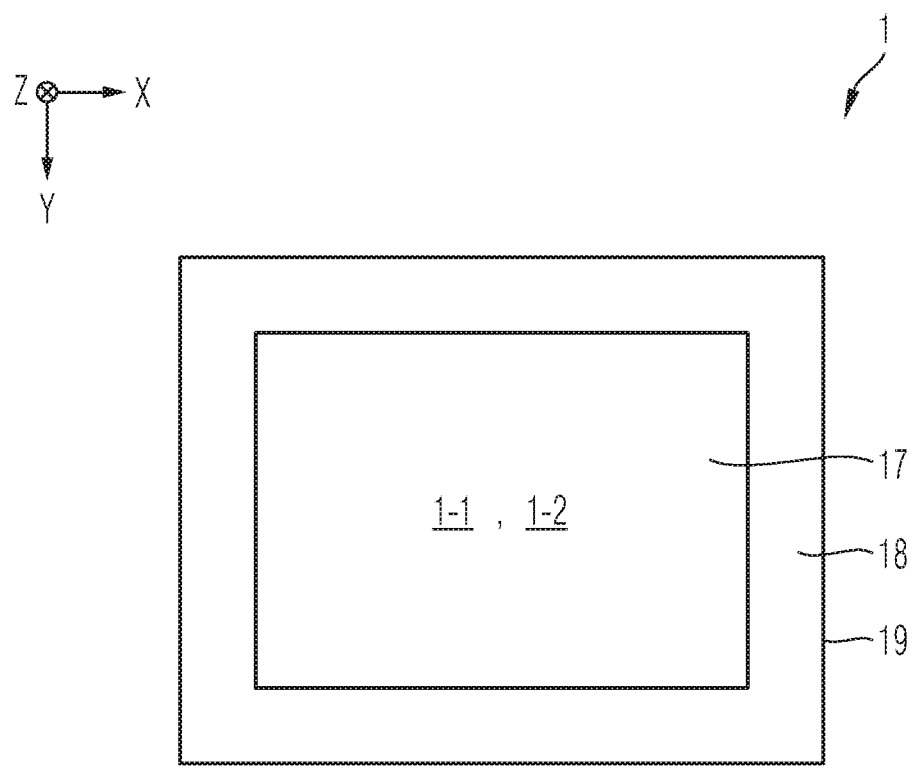

DIODE STRUCTURE OF A POWER SEMICONDUCTOR DEVICE

RELATED APPLICATIONS

This application is a continuation of and claims priority to U.S. application Ser. No. 15/708,180 filed on Sep. 19, 2017, which in turn claims priority to German Application No. 102016117723.7 filed on Sep. 20, 2016, the content of said application is incorporated by reference herein in its entirety.

TECHNICAL FIELD

This specification refers to embodiments of a power semiconductor device having a diode structure and to embodiments of processing a power semiconductor device having a diode structure.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. For example, the power semiconductor device is a diode or, respectively, includes a diode structure so as to allow flow of a load current in a forward or a reverse direction and to block a voltage in another direction.

Further, a power semiconductor device can be a controlled device. For example, a turn-on functionality may be provided so as to allow a forward voltage to be blocked. Additionally, a turn-off functionality can be provided so as to inhibit flow a load current in a forward direction.

For example, the load current path may be controlled by means of an insulated electrode, sometimes referred to as gate electrode. For example, upon receiving a corresponding control signal from, e.g., a driver unit, the control electrode may set the power semiconductor device in one of a conducting state (which is also referred to as "on-state") and a blocking state.

A power semiconductor device shall usually exhibit low losses. If the power semiconductor device includes a transistor functionality, i.e., provides for a switching capability, the total losses are formed essentially by on-state losses and by switching losses. In order to keep the on-state losses low, a lifetime of the charge carriers contributing to the load current should be comparatively long, whereas in order to keep the switching losses low, the lifetime should be comparatively short.

SUMMARY

According to an embodiment, a power semiconductor device comprises a semiconductor body coupled to each of a first load terminal and a second load terminal. The semiconductor body includes a drift region with dopants of a first conductivity type; at least a diode structure configured to conduct a load current between the terminals and comprising an anode port electrically connected to the first load terminal and a cathode port electrically connected to the second load terminal; a field stop region with dopants of the first conductivity type at a higher dopant concentration than the drift region, wherein the field stop region is arranged between the cathode port and the drift region. The cathode port comprises first port sections with dopants of the first conductivity type and second port sections with dopants of a second conductivity type complementary to the first conductivity type, a transition between each of the second port sections and the field stop region forming a respective pn-junction that extends along a first lateral direction, wherein a diffusion voltage of a respective one of the pn-junctions in an extension direction perpendicular to the first lateral direction is greater than a lateral voltage drop laterally overlapping with the lateral extension of the respective pn-junction.

According to a further embodiment, a power semiconductor device comprises a semiconductor body coupled to each of a first load terminal and a second load terminal. The semiconductor body includes a drift region with dopants of a first conductivity type; at least a diode structure configured to conduct a load current between the terminals and comprising an anode port electrically connected to the first load terminal and a cathode port electrically connected to the second load terminal; a field stop region with dopants of the first conductivity type at a higher dopant concentration than the drift region, wherein the field stop region is arranged between the cathode port and the drift region. The cathode port comprises first port sections with dopants of the first conductivity type and second port sections with dopants of a second conductivity type complementary to the first conductivity type, a transition between each of the second port sections and the field stop region forming a respective pn-junction that extends along a first lateral direction. The second load terminal exhibits a contact area facing to the semiconductor body, and wherein, in an active region of the power semiconductor device, the percentage share of the contact area laterally overlapping with the second port sections is smaller than the percentage share of the contact area laterally overlapping with the first port sections by a factor of at least two. The percentage share of the contact area laterally overlapping with the second port sections increases along a direction from the diode structure to an adjacent structure of the power semiconductor device, the adjacent structure comprising at least one of an edge structure and a transistor structure.

According to another embodiment, a method of processing a power semiconductor device comprises providing a semiconductor body to be coupled to each of a first load terminal and a second load terminal of the power semiconductor device and forming, in the semiconductor body a drift region with dopants of a first conductivity type; at least a diode structure configured to conduct a load current between the terminals and comprising an anode port to be electrically connected to the first load terminal and a cathode port to be electrically connected to the second load terminal; a field stop region with dopants of the first conductivity type at a higher dopant concentration than the drift region, wherein the field stop region is arranged between the cathode port and the drift region. The method further comprises forming, in the cathode port, first port sections with dopants of the first conductivity type and second port sections with dopants of a second conductivity type complementary to the first conductivity type, a transition between each of the second port sections and the field stop region forming a respective pn-junction that extends along a first lateral direction; and ensuring that a diffusion voltage of a respective one of the pn-junctions in an extension direction perpendicular to the first lateral direction is greater than a lateral voltage drop laterally overlapping with the lateral extension of the respective pn-junction.

According to a yet further embodiment a method of processing a power semiconductor device comprises providing a semiconductor body to be coupled to each of a first load terminal and a second load terminal of the power semiconductor device and forming, in the semiconductor body: a drift region with dopants of a first conductivity type; at least a diode structure configured to conduct a load current between the terminals and comprising an anode port to be electrically connected to the first load terminal and a cathode port to be electrically connected to the second load terminal; a field stop region with dopants of the first conductivity type at a higher dopant concentration than the drift region, wherein the field stop region is arranged between the cathode port and the drift region. The method further comprises forming, in the cathode port, first port sections with dopants of the first conductivity type and second port sections with dopants of a second conductivity type complementary to the first conductivity type, a transition between each of the second port sections and the field stop region forming a respective pn-junction that extends along a first lateral direction. The second load terminal exhibits a contact area facing to the semiconductor body. The cathode port is formed such that: in an active region of the power semiconductor device, the percentage share of the contact area laterally overlapping with the second port sections is smaller than the percentage share of the contact area laterally overlapping with the first port sections by a factor of at least two; and such that the percentage share of the contact area laterally overlapping with the second port sections increases along a direction from the diode structure to an adjacent structure of the power semiconductor device, the adjacent structure comprising at least one of an edge structure and a transistor structure.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 4 schematically and exemplarily illustrates a section of a vertical cross-section of a power semiconductor device in accordance with one or more embodiments;

FIG. 5A schematically and exemplarily illustrates a section of a horizontal cross-section of a power semiconductor device in accordance with one or more embodiments;

DETAILED DESCRIPTION

Figure 1:
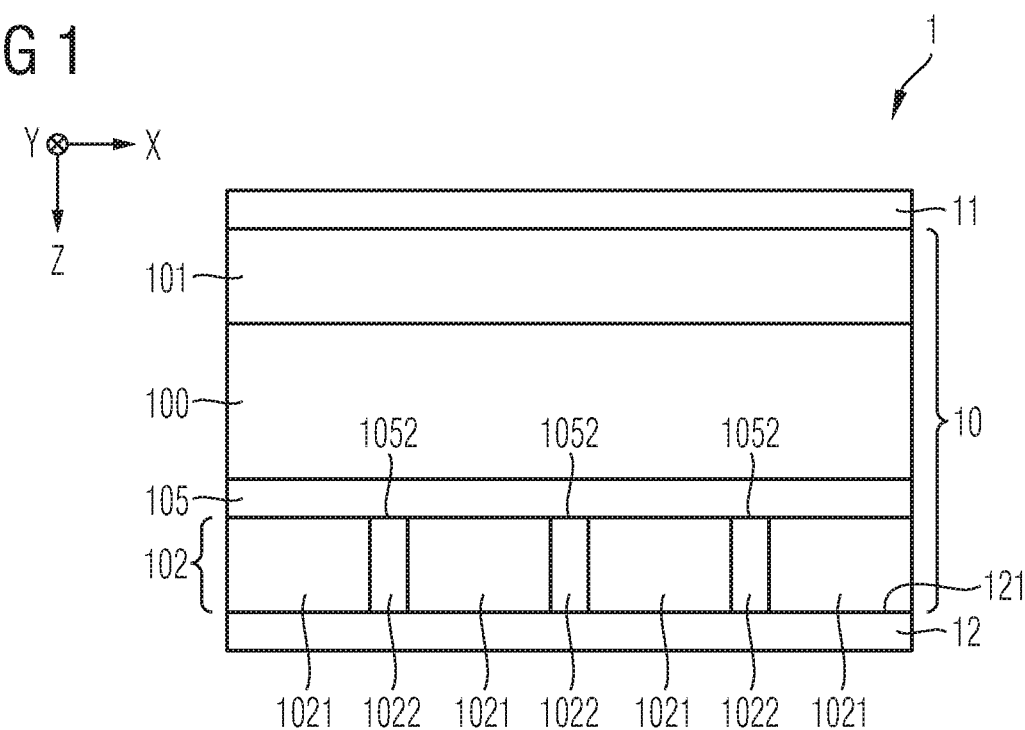
FIG. 1 schematically and exemplarily illustrates a section of a vertical cross-section of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y and may thus represent a vertical direction.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or needle cell configuration, such as a power semiconductor diode or a power semiconductor transistor, that may be used within a power converter or a power supply. Thus, in an embodiment, the semiconductor device is configured to carry a load current that is to be fed to a load and/or, respectively, that is provided by a power source. For example, the semiconductor device may comprise one or more active power semiconductor cells, such as a monolithically integrated diode cell, a monolithically integrated transistor cell, a monolithically integrated IGBT cell, a monolithically integrated RC-IGBT cell, a monolithically integrated MOS Gated Diode (MGD) cell, a monolithically integrated MOSFET cell and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V. For example, the processed semiconductor device described below may be a semiconductor device exhibiting a stripe cell configuration or a needle cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

Figure 2:
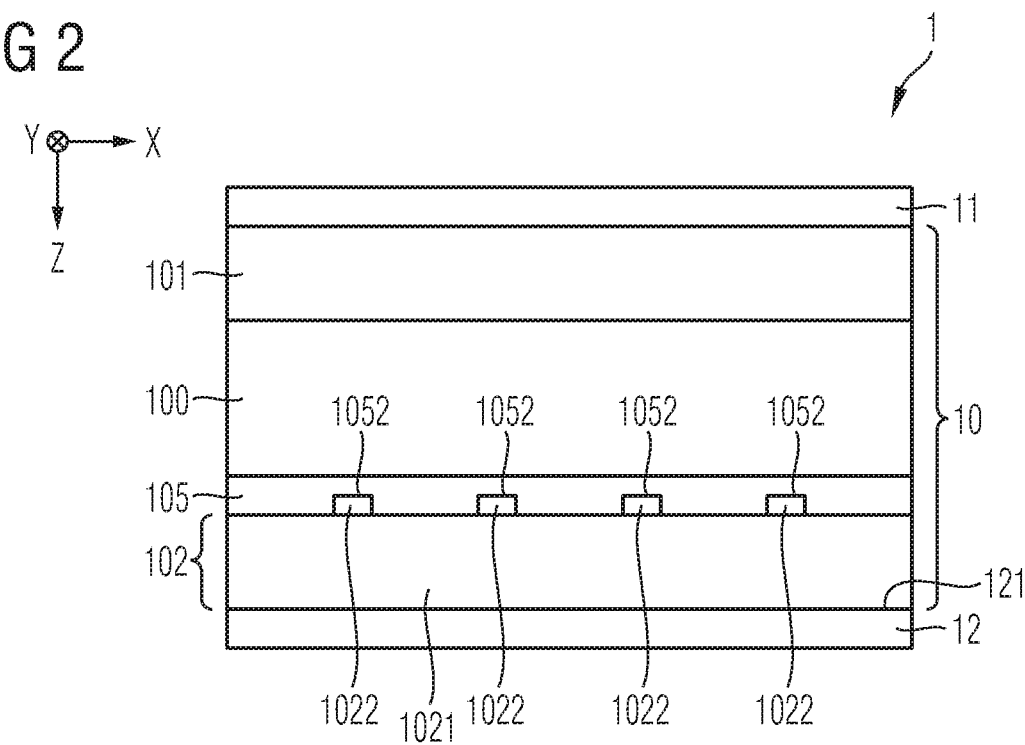
FIG. 2 schematically and exemplarily illustrates a section of a vertical cross-section of a power semiconductor device in accordance with one or more embodiments.

FIG. 1 and FIG. 2 each schematically and exemplarily illustrate a section of a vertical cross-section of a power semiconductor device 1 in accordance with some embodiments. In the following, it will be referred to each of FIG. 1 and FIG. 2.

The illustrated cross-sections are in parallel to a plane defined by the first lateral direction X and the extension direction Z. Each of the illustrated components of the power semiconductor device 1 may extend along the second letter direction Y.

The power semiconductor device 1 comprises a semiconductor body 10, e.g., based on silicon or silicon carbide. Other possible semiconductor materials are mentioned further below. The semiconductor body 10 is coupled to each of a first load terminal 11 and a second load terminal 12 of the power semiconductor device 1. For example, the first load terminal 11 comprises a first metallization, and the second load terminal 12 may comprise a second metallization. The power semiconductor device 1 may exhibit a vertical set-up, according to which the semiconductor body 10 is sandwiched between the first load terminal 11 and the second load terminal 12. The first load terminal 11 may further constitute a frontside of the device 1, and the second load terminal 12 may further constitute the backside of the device 1. Accordingly, the first metallization of the first load terminal 11 can be a frontside metallization, and the second metallization of the second load terminal 12 can be a backside metallization. For example, by means of these terminals 11 and 12, the power semiconductor device receives and outputs a load current. Accordingly, at least one of these 11 and 12, e.g., the first load terminal 11 can include one or more bonding pads (not illustrated) so as to interface, e.g., with a number of bond wires.

The semiconductor body 10 includes a drift region 100 with dopants of a first conductivity type. For example, the drift region 100 is an n$^-$-doped region. Further, the dopant concentration and the total extension of the drift region 100 along the extension direction Z may essentially define a blocking capability, e.g., a maximum blocking voltage of the power semiconductor device 1. For example, the blocking voltage is greater than 500 V, greater than 1 kV, or even greater than 1.5 kV.

In the semiconductor body 10, at least one diode structure can be provided, wherein this diode structure can be configured to conduct the load current between the terminals 11 and 12. For example, the number of diode structures provided in the semiconductor body are configured for a nominal load current of at least 10 A, of at least 50 A, or of even more than 100 A.

The diode structure can include an anode port 101 that is electrically connected to the first load terminal 11 and a cathode port 102 that is electrically connected to the second load terminal 12. For example, at least in the drift region, the load current substantially flows in a direction in parallel to the extension direction Z.

For example, the anode port 101 is constituted by a semiconductor region doped with dopants of the second conductivity type and arranged in electrical contact with the first load terminal. For example, the anode port 101 is a p-doped region electrically connected to the first load terminal 11. The anode port 101 may be arranged in between the first load terminal 11 and the drift region 100. As the drift region 100 and the anode port 101 may be complementary doped in terms of the dopant type, a transition between the drift region 100 and the anode port 101 may form a pn-junction, wherein this pn-junction may be configured to block the blocking voltage applied between the terminals 11 and 12. In an embodiment, the anode port 101 can be formed by the same semiconductor region that also forms a so-called channel region (which is also referred to as "body region"), wherein the channel region may form a part of a transistor structure of the power semiconductor device 1. This optional aspect will be elucidated in more detail with respect to the exemplary embodiment in accordance with FIG. 4.

The cathode port 102 comprises semiconductor regions electrically connected to the second load terminal and including dopants of the first conductivity type, e.g., n-doped regions. Aspects of the present specification are directed to the certain configurations of the cathode port 102.

Before describing optional aspects of the cathode port 102, it shall be understood that the semiconductor body 10 may further comprise a field stop region 105 that includes dopants of the first conductivity type. For example, the dopant concentration of the field stop region 105 is higher than the dopant concentration of the drift region 100, e.g., by a factor of at least 5, of at least 20 or of even more than 50. For example, the field stop region 105 is an n$^+$-doped region. Further, the total extension of the drift region 100 in the extension direction Z can amount to at least twice of the total extension of the field stop region 105 in the extension direction Z. The total extension of the field stop region 105 in the extension direction Z may be in the range of 1 to 200 µm, in the range of 3 to 80 µm, or in the range of 5 to 40 µm, and its dopant concentration may amount to at least $1*10^{14}$ cm$^{-3}$, to at least $8*10^{14}$ cm$^{-3}$, or to even more than $2*10^{15}$ cm$^{-3}$. Of course, choosing the spatial dimensions and the dopant concentration of the field stop region 105 may depend on the desired blocking voltage of the power semiconductor device 1. In embodiment, the dopant concentration of the field stop region 105 may vary along the extension direction Z, which will be explained in more detail further below.

The field stop region 105 may be arranged between the cathode port 102 and the drift region 100. In an embodiment, the cathode port 102 is coupled to the drift region 100 by means of the field stop region 105. Accordingly, the cathode port 102 does not interface directly with the drift region 100, but the interface between these regions is rather formed by the field stop region 105, in accordance with an embodiment. In other words, the cathode port 102 may be separated from the drift region 100 by means of the field stop region 105.

The cathode port 102 of the diode structure may comprise first port sections 1021 with dopants of the first conductivity type and second port sections 1022 with dopants of the second conductivity type that is complementary to the first conductivity type.

As schematically and exemplarily illustrated in FIG. 1, the port sections 1021 and 1022 can be arranged laterally and alternately adjacent to each other along the first lateral direction X and in electrical contact with the second load terminal 12. Accordingly, an electrical contact can be established between each of the first port sections 1021 and the second load terminal 12, and between each of the second port sections 1022 and the second load terminal 12. For example, each of the first port sections 1021 and the second port sections 1022 is arranged in contact with the second load terminal 12. Further, each of the first port section 1021 and the second port section 1022 can exhibit the same respective total extension in the extension direction Z.

For example, in accordance with FIG. 1, each of transitions between the first port sections 1021 and the second load terminal 12 and transitions between the second port sections 1022 and the second load terminal 12 form a respective ohmic contact.

In another embodiment, as schematically and exemplarily illustrated in FIG. 2, only the first port sections 1021 are arranged in electrical contact with the second load terminal 12, and the second port sections 1022 are isolated from the second load terminal 12 by means of the first port sections 1021. As illustrated, in this embodiment, the first port sections 1021 may in fact be formed by a contiguous first port section 1021 and such contiguous first port section 1021 may spatially isolate the second port sections 1022 from the second load terminal 12. For example, thereby, the second port sections 1022 may be electrically floating.

Irrespective of the two spatial configurations of the second port sections 1022 mentioned above with respect to FIG. 1 and FIG. 2, i.e., irrespective of whether the second port sections 1022 are arranged in electrical contact with the second load terminal 12 or spatially isolated therefrom by means of the first port section 1021, the following may apply:

In relation to the drift region 100, the first port sections 1021 may be doped with the same dopant type as the drift region 100, i.e., the first type, and the second port sections 1022 may be doped with a dopant type complementary to the dopant type present in the drift region 100, i.e., the second type. For example, the first port sections are n$^+$-doped semiconductor regions, and the second port sections 1022 are p-doped semiconductor regions.

The dopant concentration of the first port regions 1021—which comprise dopants of the first conductivity type—may be in the range of 1e18 to 5e20 cm$^{-3}$, or in the range of 2e19 to 2e20 cm$^{-3}$. For example, the dopant concentration of the first port regions 1021 is lower than the dopant concentration of the field stop region 105 by a factor of at least 100. For example, the dopants of the first conductivity type comprise at least one of phosphorus (P), sulfur (S), selenium (Se) and arsenic (As). In order to provide for such low dopant concentration, which may even amount to approximately 5e17 cm$^{-3}$ in case of selenium being the dopant material, a damage implantation may be carried out, in accordance with an embodiment.

The dopant concentration of the second port regions 1022—which comprise dopants of the second conductivity type—may be in the range of 1e16 to 5e20 cm$^{-3}$, in the range of 5e16 to 1e19 cm$^{-3}$, or in the range of 1e17 to 1e18 cm$^{-3}$. For example, the dopant concentration of the second port regions 1022 is lower than the dopant concentration of the first port regions 1021 by a factor of at least 2, of at least 5, or of at least 10.

In an embodiment, the cathode port 102 contributes to the diode functionality predominantly by means of the first port sections 1021, and the second port sections 1022 may serve another function that will be explained in more detail below. This difference in functionality may have an impact with regards to the spatial dimensions of the first port sections 1021 and the second port sections 1022, some exemplary of which shall now be explained:

For example, with regards to the diode structure, the second port sections 1022 constitutes a percentage of less than 50%, less than 20% or of even less than 5% of the total volume of the cathode port 102. The higher the percentage share of the second port sections 1022, the greater the reduction of the emitter efficiency, in accordance with an embodiment. For example, the second port sections 1022 are configured to refrain from dynamically injecting charge carriers.

Further, each of the second port sections 1022 may exhibit one of a stripe structure whose total extension in the second lateral direction Y amounts to at least a multiple of its total extension in the first letter direction X, an island structure, e.g., with a circular or ellipsoidal or rectangular circumference, and a comb structure.

In an embodiment, regarding for example FIG. 1, the second port sections 1022 may exhibit a respective total extension in the first lateral direction X smaller than the total extension along the first lateral direction of each of the first port sections 1021. This factor may amount to at least two, to at least five, or to at least ten; accordingly, a respective first port section 1021 may exhibit a width at least twice as large as a respective width of a second port section 1022. With regards to the embodiment in accordance with FIG. 2, this factor can be even greater; i.e., the contiguous first port section 1021 may exhibit a width at least ten times as large as respective width of a second port section 1022.

The width of a respective second port section 1022 may be less than 20 µm; e.g., the width is in the range 0.1 µm to 20 µm, in the range of 1 µm to 10 µm, or in the range of 2 µm to 8 µm.

Figure 5B:
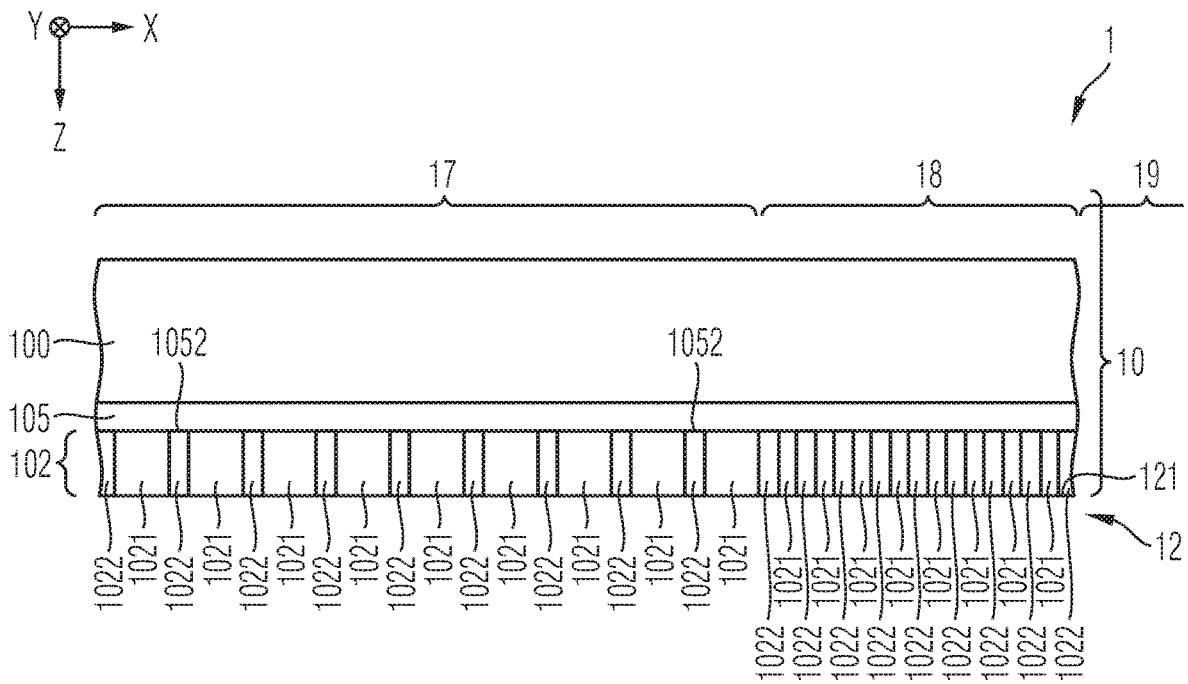
FIG. 5B-5C each schematically and exemplarily illustrate a section of a vertical cross-section of a power semiconductor device in accordance with one or more embodiments.

Further, the second load terminal 12 can exhibit a contact area 121 facing to the semiconductor body 10, wherein, in an active region (cf., e.g., reference numeral 17 in FIG. 5A) of the power semiconductor device 1, the percentage share of the contact area 121 laterally overlapping with the second port sections 1022 can be smaller than the percentage share of the contact area 121 laterally overlapping with the first port sections 1021 by a factor of at least two, of at least five, or of at least ten.

Accordingly, from the above it becomes clear that, in an embodiment, at least in the active region of the power semiconductor device 1, the cathode port 102 can be predominantly formed by the first port section(s) 1021 but also includes second port sections 1022 that are complementary doped with regards to the dopant type and that may either interrupt the first port section 1021, as in accordance with the embodiment of FIG. 1, or "docket" to the first port section 1021 without interrupting it, as in accordance with the embodiment of FIG. 2.

Now referring to FIG. 5A, which schematically and exemplarily illustrates a section of a horizontal cross-section of the power semiconductor device 1 in accordance with an embodiment, the power semiconductor device 1 may comprise an active region 17 that includes one or more diode structures 1-1, e.g., configured in a manner as described above with respect to FIG. 1 and FIG. 2. In the active region 17, there may be arranged, in addition to the one or more diode structures 1-1, one or more transistor structures 1-2, e.g., adjacent to one of the diode structures 1-1, wherein each transistor structure 1-2 may exhibit an IGBT configuration. The number of transistor structures may also be configured to conduct the nominal load current of, e.g., 10 A, of at least 50 A, or of even more than 100 A.

Thus, the active region 17 of the power semiconductor device 17 may be configured to conduct the load current between the first load terminal 11 and the second load terminal 12. For example, a forward load current is conducted by the one or more transistor structure 1-2, and a reverse load current is conducted by the one or more diode structures 1-1.

The active region 17 may be surrounded by a termination structure 18, which may be terminated by an edge structure 19. The edge structure 19 may essentially be formed by an edge that may have come into being by means of wafer dicing. For example, the termination structure 18 is not configured to conduct the load current but rather serves another purpose, e.g., the purpose of avoiding too high electrical field peaks. Thus, the termination structure 18 may be a non-active region.

Exemplary aspects of the transistor structure 1-2 are schematically and exemplarily illustrated in FIG. 4, which shows a section of a vertical cross-section. Accordingly, the transistor structure 1-2 may comprise an emitter region 103, e.g., a backside emitter that can be electrically connected to the second load terminal 12 on the one side and to the field stop region 105 on the other side. The field stop region 105 may be configured layer-like and may extend, without interruption, into each of the diode structure 1-1 and the transistor structure 1-2, in accordance with an embodiment.

For example, the emitter region 103 comprises dopants of the second conductivity type, e.g., the emitter region 103 is a p$^+$-doped semiconductor region.

In proximity to the first load terminal 11, there may be arranged a control electrode 131. For example, the control electrode 131 laterally overlaps with the emitter region 103 along the first lateral direction X. The control electrode 131 may be configured as a planar electrode or, as illustrated, as a trench electrode included in a trench 13. The control electrode 131 may be electrically insulated from the semiconductor body 10 by means of an insulator 132, e.g., an oxide. Adjacent to the insulator 132, there can be provided a source region 104, which may comprise dopants of the first conductivity type and which may be electrically connected to the first load terminal 11. For example, the source region 104 is an n$^+$-doped semiconductor region arranged in contact with the first load terminal 11. The source region 104 may be isolated from the drift region 100 by a channel region (also referred to as "body region"), which may be formed by the same semiconductor region that also forms the anode port 101 of the diode structure 1-1. For example, the channel region 101 isolating the source region 104 from the drift region 100 is a p-doped region. The control electrode 131 may be configured to induce an inversion channel in this channel region 101, e.g., upon receiving a corresponding control signal that may be formed by a voltage applied between the first load terminal 11 and a control terminal (not illustrated) of the power semiconductor device 1 electrically connected to the control electrode 131.

For example, the transistor structure 1-2 exhibits an IGBT configuration. Accordingly, the transistor structure 1-2 may be formed in a common manner so as to provide for IGBT functionality and it may exhibit IGBT typical features. As already mentioned above, aspects of the present specification are rather directed to the certain configurations of the cathode port 102, some of which shall now be elucidated:

For example, in the diode structure 1-1, e.g., as illustrated in FIG. 1 or in FIG. 2, a transition between each of the second port sections 1022 and the field stop region 105 forms a respective pn-junction 1052 that extends along a first lateral direction X. The total extension of the pn-junction 1052 in the first lateral direction X may correspond to the width of the respective second port section 1022.

Figure 3:
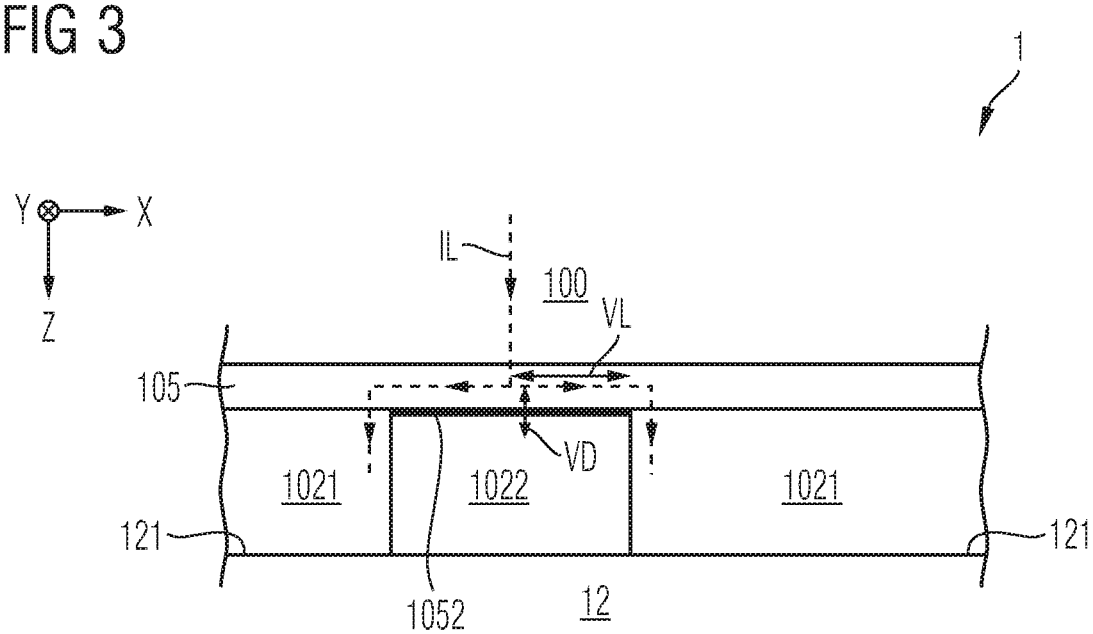
FIG. 3 schematically and exemplarily illustrates a section of a vertical cross-section of a power semiconductor device in accordance with one or more embodiments.

Further referring to FIG. 3, each of the pn-junctions 1052 may exhibit a diffusion voltage VD in parallel to the extension direction Z that is perpendicular to the first lateral direction X. For example, in case of Si forming the basis of the semiconductor body 10, the diffusion voltage VD is in the range of 0.3 V to 0.9 V, in the range of 0.4 V to 0.8 V, or in the range of 0.5 V to 0.7 V, wherein the exact amount may depend on the dopant concentrations of the respective second port section 1022 and the field stop region 105 and on the temperature. In case of SiC forming the basis of the power semiconductor body 10, the diffusion voltage VD may be significantly greater.

In accordance with an embodiment, the diffusion voltage VD of a respective one of the pn-junctions 1052 is greater than a lateral voltage drop VL laterally overlapping with the lateral extension of the respective pn-junction 1052. In an embodiment, this effect—VD being greater than VL—occurs during a nominal state of the power semiconductor device 1, e.g., if the semiconductor body conducts a load current in the range of the nominal load current for which the power semiconductor has been designed. In contrast, during an overload state, e.g., when the load current exceeds the nominal load current by a factor of two, the effect must not necessarily be present. Or, if no load current is being conducted, there is obviously substantially no such lateral voltage drop VL present. This aspect is elucidated in more detail below.

For example, the lateral voltage drop VL is caused by a part of the load current IL formed by charge carriers of the first conductivity type, e.g., electrons. This load current IL may flow between the first load terminal 11 and the second load terminal 12, i.e., substantially in parallel to the extension direction Z. However, the part of the load current IL does not cross the pn-junctions 1052, but rather circumvents the second port sections 1022. Thereby, the lateral voltage drop VL may occur. For example, the lateral voltage drop VL occurs over a distance in the first lateral direction X amounting to 50% of the total extension in the first lateral direction X, e.g., amounting to 50% of the maximum extension in the first lateral direction X of the respective second port section 1022. The 50% may be constituted by the distance between the lateral center of the respective second port section 1022 and one of its lateral ends. The same voltage drop, but with the other polarity, may occur at the other 50%. Accordingly, the sum of the voltage drop along the entire lateral extension of the second pn-junction 1052 may amount to substantially zero.

The difference in voltage between the diffusion voltage VD and the lateral voltage drop VL may amount to at least 10 mV, to at least 20 mV or to more than 50 mV.

Accordingly, the embodiments described herein may be configured so as to fulfill the conditions as laid out in the following expressions:

$$VL < VD \tag{1}$$

$$VD\text{-}VL > 10 \text{ mV;} \tag{2}$$

wherein the magnitude of the lateral voltage drop VL may be proportional to the following physical quantities:

$$VL \sim IL*R \sim IL*0.5 \times P*1/CC(Z)*1/ZN \tag{3}$$

In expression (3), IL may be the part of the load current flowing along a distance amounting to 50% of the total lateral extension XP of the second port section 1022 in the first lateral direction X, and R may be the ohmic resistance effective along the distance. This resistance R may depend on the dopant concentration CC of the field stop region 105, wherein the dopant concentration of the field stop region may be a function of Z(CC=CC(Z)), and wherein R may further depend on the total extension ZN of the field stop region 105 in the extension direction Z. Regarding an exemplary course of the dopant concentration CC of the field stop region 105, it is referred to the embodiment of FIG. 7.

As it becomes apparent from the above, the lateral voltage drop VL may depend on the total load current. In an embodiment, the power semiconductor device 1 is configured to fulfill the conditions as laid out in expressions (1) and (2) at least as long as the load current is equal to or smaller than a nominal load current for which the power semiconductor device 1 is designed, e.g., as long as the power semiconductor device 1 is operated within a nominal voltage range and a nominal current range for which it has been designed. Of course, if the power semiconductor device 1 is in an overload state in which the load current exceeds the nominal load current substantially, e.g., due to a short-circuit or a device failure, the condition according to equation (1) cannot be fulfilled anymore, as the lateral voltage drop VL may then increase corresponding to the increase of the load current, whereas the diffusion voltage VD of the pn-junction 1052 remains substantially unchanged, irrespective of whether the semiconductor device 1 is in a nominal state or in an overload state.

Figure 7:
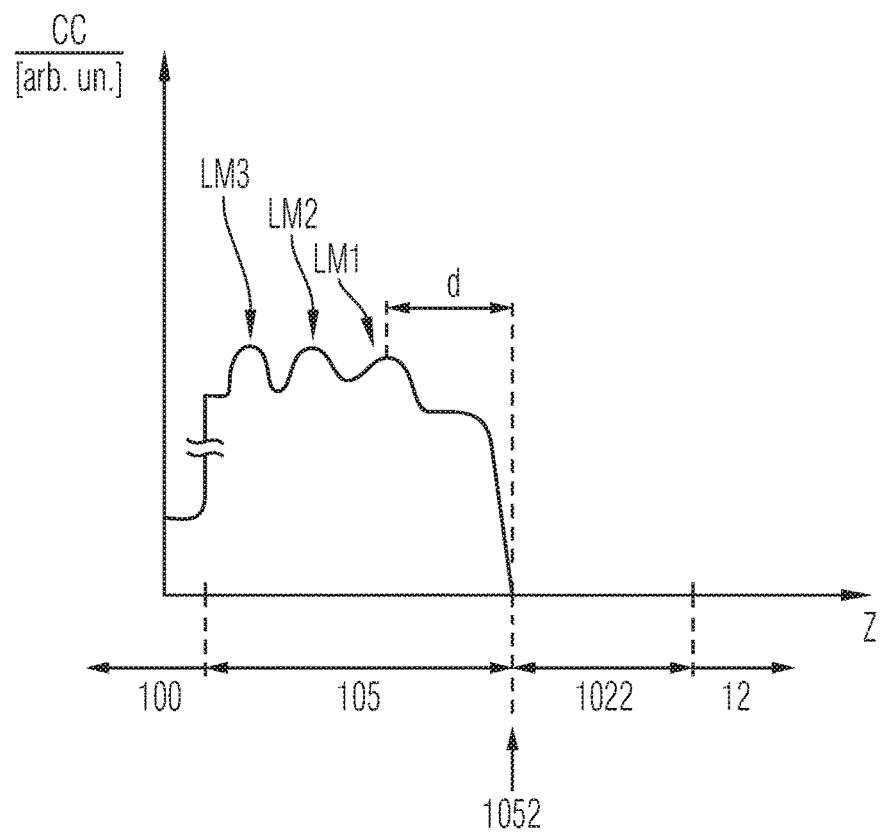
FIG. 7 schematically and exemplarily illustrates a dopant concentration profile in a power semiconductor device in accordance with one or more embodiments.

FIG. 7 schematically and exemplarily illustrates a dopant concentration profile in a power semiconductor device 1 in accordance with one or more embodiments, e.g., a concentration CC in an arbitrary unit (arb. un.), e.g., in $cm^{-3}$, of dopants of the first conductivity type along the extension direction Z, e.g., along a path that crosses each of the drift region 100, the field stop region 105 and the second port section 1022, e.g., in accordance with the embodiment illustrated in FIG. 3. For example, in proximity to the pn-junction 1052, the dopant concentration in the field stop region exhibits a minimum, e.g., in the range of $1e14$ $cm^{-3}$ to $5e14$ $cm^{-3}$. Along a direction opposite to the extension direction Z, there may occur one or more local maxima LM1, LM2, LM3 of the dopant concentration in the field stop region 105. For example, the first local maximum LM1, i.e., the local maximum which is closest to the second port section 1022, is within the range of $5e14$ $cm^{-3}$ to $8e15$ $cm^{-3}$. If present, the other local maxima LM2 and LM3 may exhibit dopant concentrations in the same range as LM1. Alternatively, the local maxima LM2 and LM3 may exhibit dopant concentrations between that of the local maxima LM1 and the minimum concentration in the proximity of the pn-junction 1052. Further, a distance d between the pn-junction 1052 and the first local maxima LM1 amounts to at least 0.5 μm, 1 μm or to at least 3 μm, in accordance with an embodiment. For example, along the distance d, the dopant concentration in the field stop region 105 is lower than $5e14$ $cm^{-3}$. Presence of the one or more local maxima may allow for decreasing the resistance R, thereby keeping VL small. Further, regarding the current path indicated in FIG. 3 by means of the dotted line, arranging the one or more local maxima LM1, LM2, LM3 in the minimum distance d with respect to the second port section may allow for comparatively "early" cause the load current IL to change its direction from Z to X/−X in the field stop region 105; i.e., a substantial part of the load current along the lateral direction is kept at the minimum distance d with regards to the second port section 1022, in accordance with an embodiment.

As has been explained above, the power semiconductor device 1 may comprise one or more transistor structures 1-2. Accordingly, the power semiconductor device 1 may be configured to be set in the blocking state and the on-state. For example, during the blocking state, a voltage applied between the first load terminal 11 and the second load terminal 12 can be blocked and flow of a forward load current is inhibited. However, a reverse load current may be conducted by the power semiconductor device by means of the one or more diode structures 1-1. When being in the on-state, the forward load current can be conducted by the power semiconductor device in a direction opposite to the direction of the reverse current, e.g., by means of the number of transistor structure 1-2.

For example, the power semiconductor device 1 may thus exhibit an RC-IGBT configuration which may essentially be formed by the one or more diode structures 1-1 and the one or more transistor structures 1-2.

In an embodiment, each of the second port sections 1022 can be configured to refrain from emitting charge carries, e.g., charge carriers of the second conductivity type, towards the drift region 100 during a turn-off process in the one or more transistor structures 1-2. For example, such functionality of the second port sections 1022 is maintained up to a threshold value of the total load current, wherein such threshold value may amount to at least twice the nominal load current for which the power semiconductor device 1 is designed, in accordance with an embodiment.

Further, the second port sections 1022 can be configured to drain charge carriers of the second conductivity type. Thereby, the second port sections 1022 can be configured to reduce an emitter efficiency of the power semiconductor device 1, e.g., the emitter efficiency of the cathode port 102.

For example, if the diode structure 1-1 is configured in accordance with the embodiment of FIG. 2, the dopant concentration and the spatial dimensions of the second port sections 1022 can be chosen such that a pn-junction formed by transition between the second port sections 1022 and the contiguous first port section 1021 does not avalanche during a turn-off operation in the transistor structure 1-2. For example, to this end, the dopant concentration of the second port sections 1022 can be kept below $1*10^{17}$ cm$^{-3}$, in accordance with an embodiment.

As has been explained above, the cathode port 102 may provide for the diode functionality predominantly by means of the first port sections 1021, and the second port sections 1022 may serve another function, e.g., as has been described in the preceding paragraphs. As has further been explained above, this difference in functionality may have an impact with regards to the dopant concentration and/or spatial dimensions of the first port sections 1021 and the second port sections 1022. For example, the second load terminal 12 may exhibit the contact area 121 facing to the semiconductor body 10, wherein, in the active region 17 of the power semiconductor device 1, the percentage share of the contact area 121 laterally overlapping with the second port sections 1022 of the cathode port of the diode structure 1-1 can be smaller than the percentage share of the contact area 121 laterally overlapping with the first port sections 1021 of the cathode port of the diode structure 1-1 by a factor of at least two.

Figure 5C:
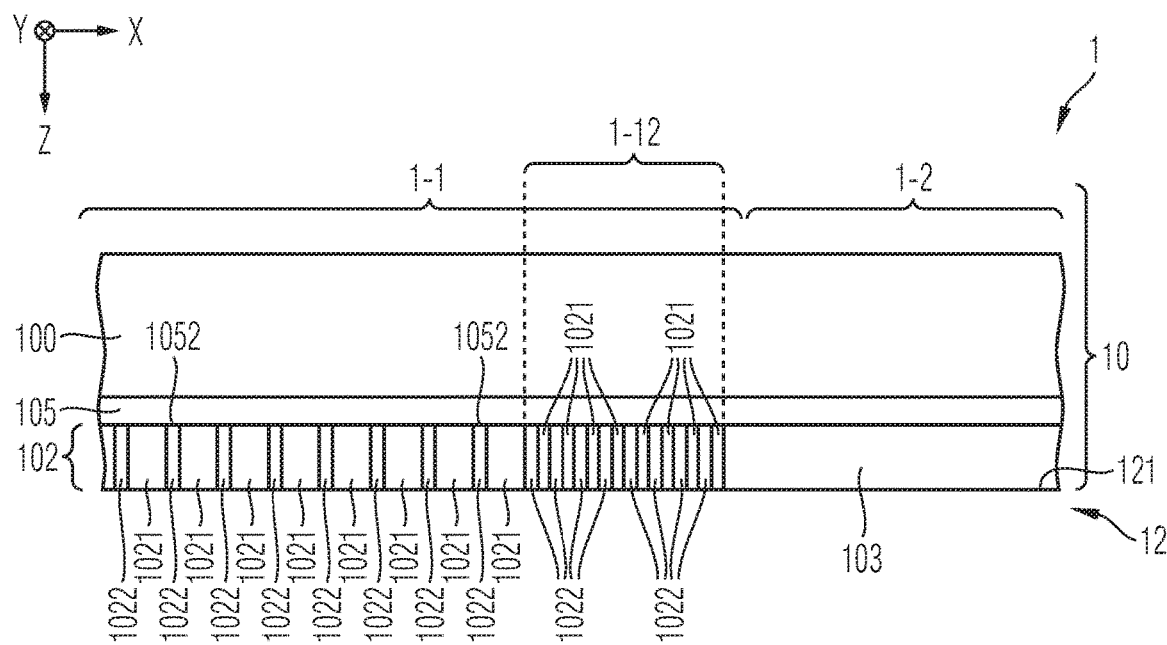

In an embodiment, the percentage share of the contact area 121 laterally overlapping with the second port sections 1022 may increase along a direction from the diode structure 1-1 to an adjacent structure of the power semiconductor device 1, wherein the adjacent structure can comprise at least one of the edge structure 19 and the transistor structure 1-2. Accordingly, the increase of the percentage share may occur in a transition region arranged in between the diode structure 1-1 and the adjacent structure 19 and/or 1-2. For example, referring to FIG. 5B, the transition region is located in the termination structure 18 arranged between the diode structure 1-1 and the edge structure 19. Accordingly, the transition region may form a part of the termination structure 18. In accordance with the embodiment illustrated in FIG. 5C and in FIG. 4, the transition region 1-12 is located between the diode structure 1-1 and the transistor structure 1-2.

Further, in the transition region 18 and/or 1-12, the power semiconductor device 1 does not conduct a load current, in accordance with an embodiment. Rather, the transition region 18 and/or 1-12 can be a non-active region, e.g., the transition region 18 and/or 1-12 can be considered as a decommissioned semiconductor zone. Thus, it shall be understood that the cathode port 102 may extend out of the diode structure 1-1 into the transition region 18 and/or 1-12, wherein, in an embodiment, in the section of the cathode port 102 that is part of the diode structure 1-1, at least one of the two conditions explained above, i.e., the lateral voltage drop VL being smaller than the diffusion voltage VD and/or the percentage share of the contact area 121 laterally overlapping with the second port sections 1022 being smaller than the percentage share of the contact area 121 laterally overlapping with the first port sections 1021 by a factor of at least two, applies, and wherein, in the section of the cathode port 102 that is not part of the diode structure but part of the transition structure, the percentage share of the contact area 121 laterally overlapping with the second port sections 1022 can increase.

For example, the increase in percentage share occurs in a step like manner or in a gradual manner. The increase in percentage share may amount to factor of at least two. For example, in the transition region, about 50% of the total volume of the cathode port may be constituted by the first port sections 1021, and the other 50% of the total volume of the cathode port may be constituted by the second port sections 1022. The portion of the second port sections 1022 may be even greater than 50%, e.g., at least 60%, at least 70% or even more than 80%. For example, the transition region 18/1-12 exhibits a total extension of at least 10 µm in the first lateral direction X. This total extension can be even greater than 50 µm, greater than 150 µm, or even greater than 250 µm. The total extension of the transition region 18/1-12 may also depend on the blocking voltage of the power semiconductor device, e.g., on the thickness of the semiconductor body 10 in the extension direction. For example, the total extension of the transition region 18/1-12 may amount to at least half of the thickness of the semiconductor body 10, to at least the thickness of the semiconductor body 10, or to at least twice of the thickness of the semiconductor body 10. Further, in the transition region 18/1-12, the port sections 1021 and 1022 can be arranged laterally and alternately adjacent to each other along the first lateral direction X and in electrical contact with the second load terminal 12. For example, in the transition region 18/1-12, each of the first port sections 1021 and the second port sections 1022 can exhibit a respective total extension in the first lateral direction X of 10% of the thickness in the extension direction Z of semiconductor body 10, e.g., of less than 5 µm, of less than 2 µm or of even less than 1 µm.

For example, due to the increase in percentage share in the transition region 18/1-12, a charge carrier plasma during an on-state of the power semiconductor device 1, i.e., during conduction of the load current, can be significantly reduced in the transition region, in accordance with an embodiment.

Figure 6:
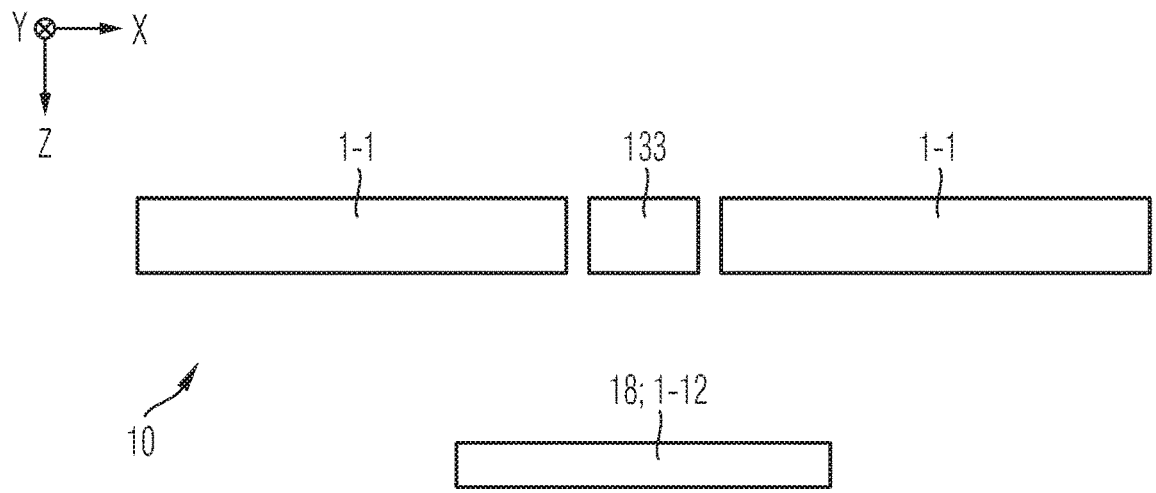
FIG. 6 schematically and exemplarily illustrates a section of a vertical cross-section of a power semiconductor device in accordance with one or more embodiments.

Referring to the embodiment in accordance with FIG. 4, the power semiconductor device 1 can further comprise a control terminal, e.g., a gate pad (not illustrated) that is electrically connected to the control electrode 131. For example, the control terminal of the power semiconductor device 1 is configured to receive a control signal from, e.g., a gate driver, wherein the control signal may be constituted by a voltage applied between the control terminal and the first load terminal 11. For example, the electrical potential of the control terminal is forwarded to the control electrode 131, thereby allowing the control electrode 131 to control the operation, e.g., a switching operation, in the transistor structure 1-2. In an embodiment, the electrical connection between the control electrode 131 and the control terminal may comprise at least a contact runner (cf. reference numeral 133 in FIG. 6) that can be arranged at least partially external of the semiconductor body 10. For example, the contact runner can be arranged in a surface structure of the power semiconductor device 1. In an embodiment, which is schematically and exemplarily illustrated in FIG. 6, the transition region 18; 1-12 where the percentage share of the contact area 121 laterally overlapping with the second port sections 1022 increases also laterally overlaps with the contact runner 133 that electrically connects the control terminal with the control electrode 131. Such location of the transition region 18; 1-12 may allow for reducing the stress imposed on the contact runner 133 during a switching operation of the power semiconductor device 1.

In accordance with another embodiment, a method of processing a power semiconductor device is presented. The method may comprise the following processing steps: providing a semiconductor body 10 to be coupled to each of a first load terminal 11 and a second load terminal 12 of the power semiconductor device and forming, in the semiconductor body 10: a drift region 100 with dopants of a first conductivity type; at least a diode structure configured to conduct a load current between the terminals 11, 12 and comprising an anode port 101 to be electrically connected to the first load terminal 11 and a cathode port 102 to be electrically connected to the second load terminal 12; and a field stop region 105 with dopants of the first conductivity type at a higher dopant concentration than the drift region 100, wherein the field stop region 105 is arranged between the cathode port 102 and the drift region 100. The method may further comprise forming, in the cathode port 102, first port sections 1021 with dopants of the first conductivity type and second port sections 1022 with dopants of a second conductivity type complementary to the first conductivity type, a transition between each of the second port sections 1022 and the field stop region 105 forming a respective pn-junction 1052 that extends along a first lateral direction X; and ensuring that a diffusion voltage VD of a respective one of the pn-junctions 1052 in an extension direction Z perpendicular to the first lateral direction X is greater than a lateral voltage drop VL laterally overlapping with the lateral extension of the respective pn-junction 1052.

In accordance with a further embodiment, a further method of processing a power semiconductor device is presented. The further method may comprise the following processing steps: providing a semiconductor body 10 to be coupled to each of a first load terminal 11 and a second load terminal 12 of the power semiconductor device 1; forming, in the semiconductor body 10: a drift region 100 with dopants of a first conductivity type; at least a diode structure configured to conduct a load current between the terminals 11, 12 and comprising an anode port 101 to be electrically connected to the first load terminal 11 and a cathode port 102 to be electrically connected to the second load terminal 12; a field stop region 105 with dopants of the first conductivity type at a higher dopant concentration than the drift region 100, wherein the field stop region 105 is arranged between the cathode port 102 and the drift region 100; forming, in the cathode port 102, first port sections 1021 with dopants of the first conductivity type and second port sections 1022 with dopants of a second conductivity type complementary to the first conductivity type, a transition between each of the second port sections 1022 and the field stop region 105 forming a respective pn-junction 1052 that extends along a first lateral direction X, wherein the second load terminal 12 exhibits a contact area 121 facing to the semiconductor body 10. For example, the cathode port 102 is formed such that in an active region 17 of the power semiconductor device 1, the percentage share of the contact area 121 laterally overlapping with the second port sections 1022 is smaller than the percentage share of the contact area 121 laterally overlapping with the first port sections 1021 by a factor of at least two; and such that the percentage share of the contact area 121 laterally overlapping with the second port sections 1022 increases along a direction from the diode structure 1-1 to an adjacent structure 1-2 (or 19) of the power semiconductor device 1, the adjacent structure comprising at least one of an edge structure 19 and a transistor structure 1-2.

Exemplary ways of implementing the methods presented above may correspond to the embodiments of the power semiconductor device 1 described above and as laid out in the dependent claims. For example, and backside of the semiconductor body 10 may be processed so as to form the cathode port 102, e.g., by positioning, dimensioning and by doping the first port sections 1021 and the second port sections 1022 such that at least one of the conditions as defined in the independent claims is fulfilled.

For example, an embodiment of the described methods may comprise forming the one or more local maxima LM1, LM2, LM3 of the dopant concentration of the field stop region 105 at a minimum distance d of 0.5 mm to the second port section 1022, as laid out in more detail with respect to FIG. 7. For example, this may comprise carrying out a proton implantation.

The power semiconductor device 1 presented above can be a bipolar power semiconductor device, e.g., a power diode or an RC-IGBT. The presented diode structure may also be employed for forming a drain region of a MOSFET, whose body diode is used as a freewheeling diode. Accordingly, the methods presented above may be directed to processing at least one of a power diode, an RC-IGBT and a MOSFET.

The embodiments disclosed above include the recognition that it is possible to control, e.g., in a bipolar power semiconductor device, a charge carrier plasma by means of the reduction of the charge carrier lifetime. Such reduction can be achieved, e.g., by means of an implantation, e.g., an electron implantation, and implantation of at least one of helium, platinum, and/or by means of diffusion, e.g., diffusion of platinum. As has already been introductorily mentioned, in order to achieve low on-state losses of the power semiconductor device, the charge carrier lifetime should be comparatively long, wherein, in order to achieve low switching losses of the power semiconductor device, a charge carrier lifetime should be comparatively short. However, impurities provided in the semiconductor body in order to reduce the charge carrier lifetime may act as a charge carrier generators in the blocking state of the power semiconductor device. Thereby, a leakage current can be increased, which may be undesirable, e.g., regarding a diode structure that is configured for the comparatively high junction temperature. In accordance with an embodiment presented above, by providing the second port section 1022 as part of the cathode port 102 at certain positions, with certain spatial dimensions and with certain dopant concentration, an appropriate emitter efficiency can be achieved that allows for both low switching and on-state losses.

In the above, embodiments pertaining to semiconductor device processing methods were explained. For example, these semiconductor devices are based on silicon (Si). Accordingly, a monocrystalline semiconductor region or layer, e.g., the semiconductor body 10, the drift region 100 and the other regions 101, 102, 1021, 1022, 103, 104 and 105 of exemplary embodiments, can be a monocrystalline Si-region or Si-layer. In other embodiments, polycrystalline or amorphous silicon may be employed.

It should, however, be understood that the semiconductor body 10 and components, e.g., regions 100, 101, 102, 1021, 1022, 103, 104 and 105 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
a semiconductor body coupled to a first load terminal and a second load terminal, wherein the semiconductor body comprises:
a drift region with dopants of a first conductivity type;
at least a diode structure configured to conduct a load current between the first and second terminals and comprising an anode port electrically connected to the first load terminal and a cathode port electrically connected to the second load terminal;
a field stop region with dopants of the first conductivity type at a higher dopant concentration than the drift region, the field stop region being arranged between the cathode port and the drift region;
an active region and a termination region laterally separating the active region from a lateral edge of the semiconductor body,
wherein the cathode port comprises:
first port sections with dopants of the first conductivity type and second port sections with dopants of a second conductivity type complementary to the first conductivity type, a transition between each of the second port sections and the field stop region forming a respective pn-junction that extends along a first lateral direction;
wherein a first group of the first and second port sections is disposed in the active region, the first group comprising the first port sections arranged alternatingly between the second port sections,
wherein a second group of the first and second port sections is disposed in the termination region, the second group comprising the first port sections arranged alternatingly between the second port sections, and
wherein a lateral separation distance between two of the second port sections in the second group that are immediately adjacent to one another is greater than a lateral separation distance between two of the second port sections in the first group that are immediately adjacent to one another.

2. The power semiconductor device of claim 1, wherein the active device region comprises one or more transistor structures, and wherein the termination region is devoid of transistor structures.

3. The power semiconductor device of claim 1, wherein the first port sections are arranged in electrical contact with the second load terminal, and wherein the second port sections are isolated from the second load terminal by the first port sections.

4. The power semiconductor device of claim 1, wherein the second port sections have a dopant concentration smaller than the dopant concentration of each of the first port sections.

5. A power semiconductor device, comprising:
a semiconductor body, comprising:
a drift region with dopants of a first conductivity type;
a field stop region with dopants of the first conductivity type at a higher dopant concentration than the drift region; and
an active region and a termination region laterally separating the active region from a lateral edge of the semiconductor body,
wherein the termination region comprises:
first port sections with dopants of the first conductivity type and second port sections with dopants of a second conductivity type complementary to the first conductivity type, a transition between each of the second port sections and the field stop region forming a respective pn-junction that extends along a first lateral direction, wherein a diffusion voltage of a respective one of the pn-junctions in an extension direction perpendicular to the first lateral direction is greater than a lateral voltage drop across a lateral extension of the respective pn-junction.

6. The power semiconductor device of claim 5, wherein the active device region comprises one or more transistor structures, and wherein the edge region is devoid of transistor structures.

7. The power semiconductor device of claim 5, wherein the semiconductor body comprises a cathode port coupled to a load electrode, and wherein the first and second port sections are disposed in the cathode port.

8. The power semiconductor device of claim 5, wherein the lateral voltage drop is caused by a part of the load current formed by charge carriers of the first conductivity type.

9. The power semiconductor device of claim 5, wherein the lateral voltage drop occurs over a distance in the first lateral direction amounting to 50% of the total extension of the respective second port section in the first lateral direction.

10. A power semiconductor device, comprising
a semiconductor body coupled to a first load terminal and a second load terminal, wherein the semiconductor body comprises:
a drift region with dopants of a first conductivity type;
an anode port electrically connected to the first load terminal
a cathode port electrically connected to the second load terminal;
a field stop region with dopants of the first conductivity type at a higher dopant concentration than the drift region, the field stop region being arranged between the cathode port and the drift region; and
a transition region laterally separating a transistor region from a diode region,
wherein the transistor region comprises one or more active transistor devices,
wherein the diode region comprises a diode structure,
wherein in the transition region and the diode region, the cathode port comprises:
first port sections with dopants of the first conductivity type and second port sections with dopants of a second conductivity type complementary to the first conductivity type, a transition between each of the second port sections and the field stop region forming a respective pn-junction that extends along a first lateral direction;
wherein a lateral separation distance between two of the second port sections in the second group that are immediately adjacent to one another is greater than a lateral separation distance between two of the second port sections in the first group that are immediately adjacent to one another.

11. The power semiconductor device of claim 10, wherein the active device region comprises one or more transistor structures, and wherein the transition region and the diode region are devoid of transistor structures.

12. The power semiconductor device of claim 10, wherein the transistor region comprises a vertical transistor, comprising:
a gate trench that extends through the anode port and into the drift region, the gate trench comprising a conductive gate electrode and a gate dielectric insulating the gate electrode from the semiconductor body; and
a source region adjacent the gate trench and vertically separated from the drift region by a portion of the anode region,
wherein the gate electrode is configured to control a conductive channel between the source region and the drift region.

13. The power semiconductor device of claim 10, wherein the vertical transistor is configured as an insulated gate bipolar transistor that is configured to conduct a forward current between the first and second load terminals, and wherein the diode structure is configured to conduct a reverse current between the first and second load terminals.

* * * * *